United States Patent
Chong et al.

(10) Patent No.: US 8,624,647 B2
(45) Date of Patent: Jan. 7, 2014

(54) DUTY CYCLE CORRECTION CIRCUIT FOR MEMORY INTERFACES IN INTEGRATED CIRCUITS

(75) Inventors: Yan Chong, San Jose, CA (US); Joseph Huang, Morgan Hill, CA (US); Pradeep Nagarajan, Santa Clara, CA (US); Chiakang Sung, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 664 days.

(21) Appl. No.: 12/690,064

(22) Filed: Jan. 19, 2010

(65) Prior Publication Data

US 2011/0175657 A1 Jul. 21, 2011

(51) Int. Cl.
*H03K 3/017* (2006.01)

(52) U.S. Cl.
USPC .......................................... 327/175; 327/172

(58) Field of Classification Search
None
See application file for complete search history.

(56) References Cited

U.S. PATENT DOCUMENTS

| | | | |
|---|---|---|---|
| 7,236,028 B1* | 6/2007 | Choi | 327/158 |
| 7,365,583 B2 | 4/2008 | Shin | |
| 7,873,131 B2 | 1/2011 | Lin et al. | |
| 7,940,103 B2* | 5/2011 | Satoh et al. | 327/175 |
| 7,990,194 B2* | 8/2011 | Shim | 327/158 |
| 2008/0164920 A1 | 7/2008 | Cho | |
| 2009/0231006 A1* | 9/2009 | Jang et al. | 327/175 |

* cited by examiner

*Primary Examiner* — Cassandra Cox
(74) *Attorney, Agent, or Firm* — Womble Carlyle Sandridge & Rice LLP

(57) ABSTRACT

Circuits and a method for correcting duty cycle distortions in an integrated circuit (IC) are disclosed. The IC includes a splitter circuit that is coupled to receive a clock signal. The clock signal is split into two different clock signals. One of the clock signals is an inverted version of the other. A delay circuit is coupled to each of the clock signals. Each of the delay circuits generates a delayed version of the corresponding clock signal. A corrector circuit is coupled to receive both the delayed versions of the clock signals. The corrector circuit generates a clock output signal with a corrected duty cycle.

20 Claims, 7 Drawing Sheets

DUTY CYCLE CORRECTION CIRCUIT FOR MEMORY INTERFACES IN INTEGRATED CIRCUITS

BACKGROUND

In digital circuits, the clock signal synchronizes communication between different parts within the circuit and between different circuits. Circuits designed to operate with the clock signal may respond at the rising or falling edge of the clock signal. Single data-rate (SDR) memory interfaces normally utilize only either the rising or falling edge to transfer data. Double data-rate (DDR) memory interfaces, on the other hand, transfer data on both the rising edge and falling edge of the clock signal. Thus, the data transfer rate in a DDR memory interface is twice as fast as the transfer rate of a regular SDR memory interface.

As data rates increase, duty cycle distortions may be problematic as the size of the window, during which valid data may be captured, may be reduced and potentially lead to the loss of data. A duty cycle is the fraction of time that the clock or system is in an "active" state. A substantially symmetrical duty cycle is required for most high speed applications as asymmetric duty cycles will make the synchronization of all the clocks in a system more difficult. A symmetrical duty cycle or a 50% duty cycle means each clock period has equal high and low periods. In other words, a clock signal with 50% duty cycle spends half the clock period at logic 1 and the other half at logic 0.

Various duty correction techniques are usually employed to correct duty cycle distortions. Static delay chains that can delay rising and falling edges of the clock signal are generally used. However, as duty cycle distortions normally vary from device to device, it is difficult to use one static delay setting to correct duty cycle distortions in different devices. It is also difficult to find the correct settings for devices operating under different process, voltage and temperature (PVT) conditions as duty cycle distortions also vary under different PVT conditions.

Therefore, it is desirable to have a duty cycle correction circuit that can automatically correct duty cycle distortions in different devices operating under different PVT conditions. It is within this context that the invention arises.

SUMMARY

Embodiments of the present invention include circuits and a method for correcting duty cycle distortions in an integrated circuit (IC).

It should be appreciated that the present invention can be implemented in numerous ways, such as a process an apparatus, a system, a device or a method on a computer readable medium. Several inventive embodiments of the present invention are described below.

In one embodiment, an IC with a corrector circuit is disclosed. The IC includes a splitter circuit that receives a clock signal and splits the clock signal into two different clock signals. In one embodiment, one of the clock signals is an inverted version of the other. Each of the clock signals is coupled to a delay circuit. Each of the delay circuits generates a delayed version of the corresponding clock signal. A corrector circuit is coupled to both the delayed versions of the clock signals to generate a clock output signal based on the delayed versions of the clock signals. The generated clock output signal has a corrected duty cycle.

In yet another embodiment in accordance with the present invention, a duty cycle correction circuit is provided. The circuit includes a latch and pulse generator circuits. One pulse generator circuit is coupled to receive a first clock signal. A first pulse signal is generated by the pulse generator circuit based on the first clock signal. Another pulse generator circuit is coupled to receive a second clock signal. A second pulse signal is generated by the pulse generator circuit based on the second clock signal. The latch receives the two pulse signals and generates a clock output signal with a corrected duty cycle based on the two pulse signals.

In an alternative embodiment in accordance with the present invention, a method of operating an IC is provided. The method includes splitting a clock signal into two different clock signals. A delay is applied to each of the two clock signals to generate delayed versions of the two clock signals. Two pulse signals are generated based on each of the delayed versions of the two clock signals. The generated pulse signals transition from one logic level to another based on the transition of the delayed version of the corresponding clock signal. A clock output with a corrected duty cycle is generated based on the first and second pulse signals.

Other aspects of the invention will become apparent from the following detailed description, taken in conjunction with the accompanying drawings, illustrating by way of example the principles of the invention.

BRIEF DESCRIPTION OF THE DRAWINGS

The invention may best be understood by reference to the following description taken in conjunction with the accompanying drawings in which.

DETAILED DESCRIPTION

Embodiments of the present invention include circuits and a method for correcting duty cycle distortions in an integrated circuit (IC).

It will be obvious, however, to one skilled in the art, that the present invention may be practiced without some or all of these specific details. In other instances, well-known operations have not been described in detail in order not to unnecessarily obscure the present invention.

The embodiments described herein provide circuits and techniques to correct duty cycle distortions in an IC to generate a clock signal with approximately 50% duty cycle across all PVT ranges. It should be appreciated that in high speed applications, e.g., high speed memory interfaces like DDR3, a 50%, or close to 50%, duty cycle is required to ensure that the transmission window is wide enough to ensure that data is appropriately captured. In high speed applications, clock signals with an asymmetric duty cycle may make data synchronization more difficult. The disclosed embodiments provide a dynamic duty cycle correction circuit that can easily correct duty cycle distortions in clock signals within an IC device. One embodiment describes a duty cycle correction circuit in an IC that splits a clock signal into two different clock signals and uses the two clock signals to generate a symmetrical, or substantially symmetrical, output clock signal. Another embodiment describes a duty cycle correction circuit that uses two signal pulses and a latch to generate a substantially symmetrical clock signal.

Figure 1:
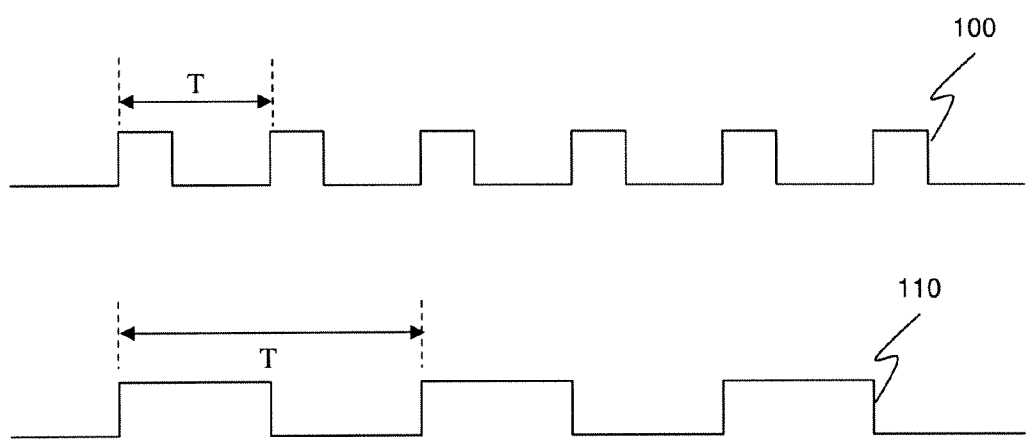
FIG. 1 shows an exemplary waveform of a clock signal with an uneven duty cycle and an exemplary waveform of a clock signal with an even duty cycle.

FIG. 1 shows exemplary waveform 100 of an asymmetrical clock signal and waveform 110 of a symmetrical clock signal. Waveform 100 has an uneven period of high and low for each clock period. Interval T as shown on waveform 100 is the clock period of the clock signal. One skilled in the art understands that one clock period refers to the period from one rising/falling edge to the next rising/falling edge. The duty cycle parameter specifies the relative duration of the logic high output during each clock period. As shown in waveform 100 of FIG. 1, each clock period T has a relatively shorter logic high duration compared to its logic low duration. As explained before, a symmetrical clock signal has a substantially 50% duty cycle. In other words, each clock period T should have an equal, or almost equal, duration of logic high and logic low outputs. Exemplary waveform 110 of FIG. 1 shows a symmetrical clock signal. Each clock period T on waveform 110 has an even duration of high and low outputs. As such, waveform 110 is a waveform of a symmetrical clock signal with a 50% duty cycle.

Figure 2A:
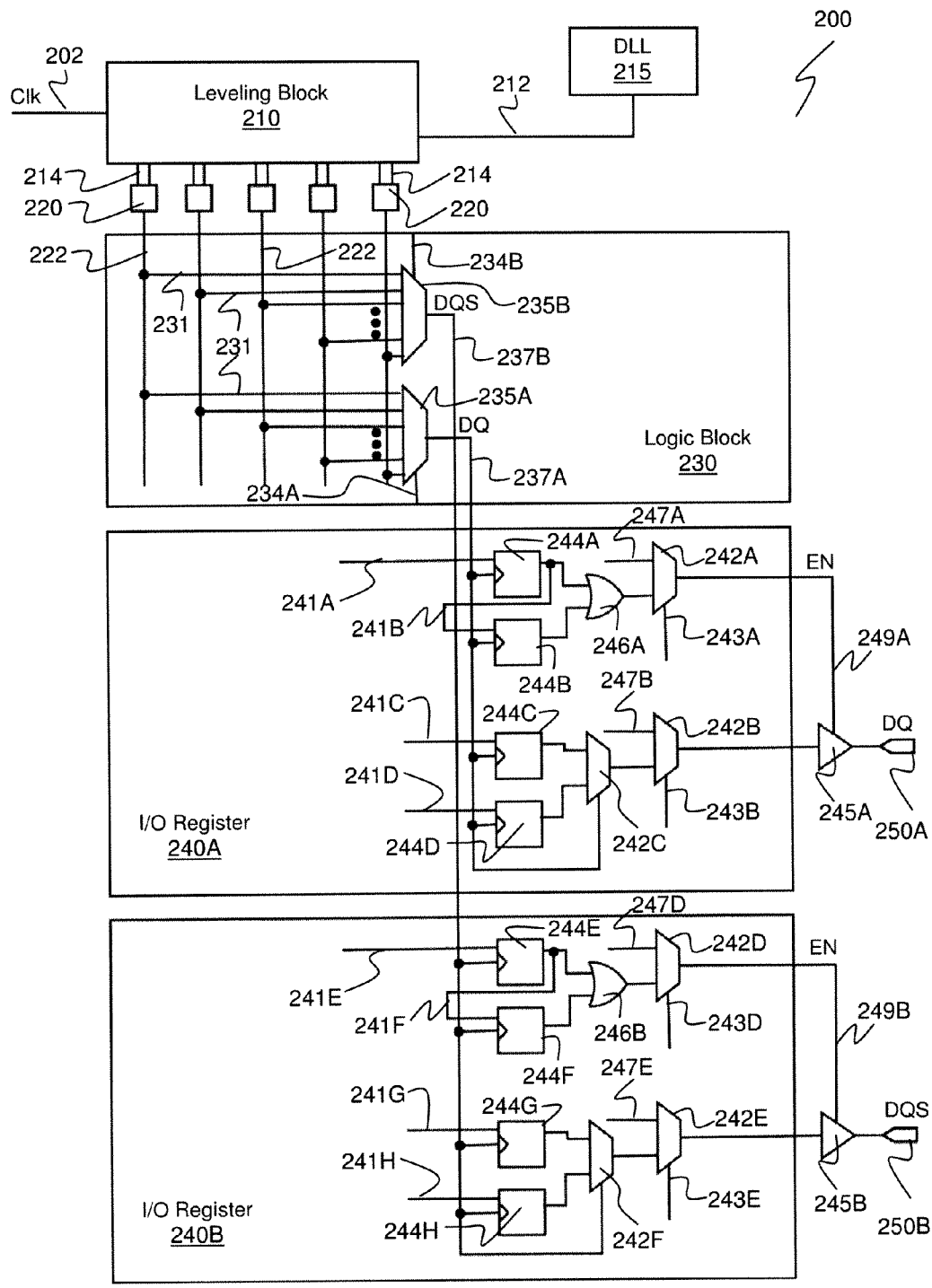
FIG. 2A, meant to be illustrative and not limiting, shows an exemplary circuit with duty corrector circuits for a memory interface in an IC as one embodiment in accordance with the present invention.

FIG. 2A, meant to be illustrative and not limiting, shows exemplary circuit 200 with duty corrector circuits for a memory interface in an IC as one embodiment in accordance with the present invention. One skilled in the art should appreciate that the embodiment of FIG. 2A shows the write path of a memory interface in an IC and output pins 250A and 250B may be connected to an external memory module. One skilled in the art should also appreciate that output pins 250A and 250B may represent the data (DQ) pin and the data strobe (DQS) pin, respectively. The embodiment of FIG. 2A shows leveling block 210 coupled to I/O registers 240A and 240B through logic block 230. Clock signal 202 is coupled to leveling block 210. In one embodiment, leveling block 210 includes a delay chain that is coupled to receive clock signal 202. In an exemplary embodiment, the delay chain is a plurality of buffers connected in series that generates a plurality of delayed versions of clock signal 202. Output 212 of delay locked-loop (DLL) 215 is coupled to leveling block 210. In the embodiment of FIG. 2A, DLL 215 is coupled to an enable input of each of the plurality of buffers in leveling block 210, details of which will be explained in later paragraphs. In one embodiment, leveling block 210 is a current-starved delay chain. DLL 215 outputs and sends a delay setting to leveling block 210 to control the delay of each leveling stage and the delay setting is maintained across different PVT conditions. Leveling block 210 generates multiple delayed versions of clock signal 202 as outputs 214.

Referring still to FIG. 2A, outputs 214 are connected to corrector circuits 220. In one embodiment, each of corrector circuits 220 includes a set/reset (SR) latch. An output of each of corrector circuits 220 is coupled to selector circuits 235A and 235B. Select inputs 234A and 234B of selector circuits 235A and 235B, respectively, control which of the plurality of inputs 231 is selected as an output for selector circuits 235A and 235B. Outputs 237A and 237B are coupled to I/O registers 240A and 240B, respectively. I/O registers 240A and 240B include multiple storage circuits or registers connected to various logic elements. Outputs 237A and 237B are connected to the clock terminals of registers 244A-244H in I/O registers 240A and 240B, respectively. In one embodiment, I/O registers 244A-244H are triggered by edges of the clock output signals from corrector circuits 220. In the embodiment of FIG. 2A, output 237A is connected to the clock terminals of registers 244A-244D, and select input 243C of selector circuit 242C in I/O register 240A. Registers 244A and 244B, coupled to logic gate 246A and selector circuit 242A, control enable terminal 249A of output buffer 245A. Output buffer 245A is coupled to output pin DQ 250A. Registers 244C and 244D are coupled to output buffer 245A through selector circuits 242C and 242B. Input terminal 241B of register 244B is coupled to the output of register 244A. One skilled in the art should appreciate that input terminals 241A, 241C and 241D may be connected to the core of the IC that may provide either a logic high or a logic low level. One skilled in the art should also appreciate that selector circuits 242A and 242B can be used to bypass registers 244A-244D, logic gate 246A and selector circuit 242C. In one embodiment, select inputs 243A and 243B are connected to a static value or a configuration random access memory (CRAM) bit to control the output of selector circuits 242A and 242B, respectively. In the embodiment of FIG. 2A, input terminals 247A and 247B are coupled to the core the IC. One skilled in the art should appreciate that input terminals 247A and 247B may be connected to registers in the core of the IC. The output of selector circuit 242A enables and disables output buffer 245A and the output of selector circuit 242B carries output data from I/O register 240A to output pin DQ 250A through output buffer 245A.

Referring still to FIG. 2A, I/O register 240B shares similarities with I/O register 240A. For the sake of brevity, elements shown in I/O register 240A and described above, e.g., registers 244E-244F, input terminals 241E-241H, input terminals 247D and 247E, select inputs 243D and 243E, selector circuits 242D-242F and logic gate 246B, are not repeated or described in detail here. Selector circuit 235B of logic block 230 selects one of the delayed versions of the clock signal from leveling block 210 as an output signal. In one embodiment, select input 234B is coupled to a core logic block in the IC. The core logic block controls select input 234B and selects different phases during a calibration process in order to determine a suitable phase for the clock signal 202. In another embodiment, select input 234A of selector circuit 235A selects one of input signals 231 as output 237A according to a selection of selector circuit 235B. For example, selector circuit 235A may select a phase shifted version of the input signal 231 that is selected as output 237B of selector circuit 235B. In an exemplary embodiment, outputs 237A and 237B are substantially 90° out of phase alignment. Output 237B is coupled to the clock terminals of registers 244E-244H in I/O register 240B. Outputs of selector circuits 242D and 242E in I/O register 240B are connected to enable terminal 249B and output buffer 245B, respectively. Output buffer 245B is connected to output pin 250B. In one embodiment, output pins 250A and 250B are DQ and DQS pins, respectively, and both DQ and DQS pins are connected to an external memory module. One skilled in the art should appreciate that DQ and DQS signals are used in DDR memory interfaces. One skilled in the art should also appreciate that when a memory interface in an IC writes to a memory module, DQS is asserted when DQ pins have data to be written to the memory module.

Figure 2B:
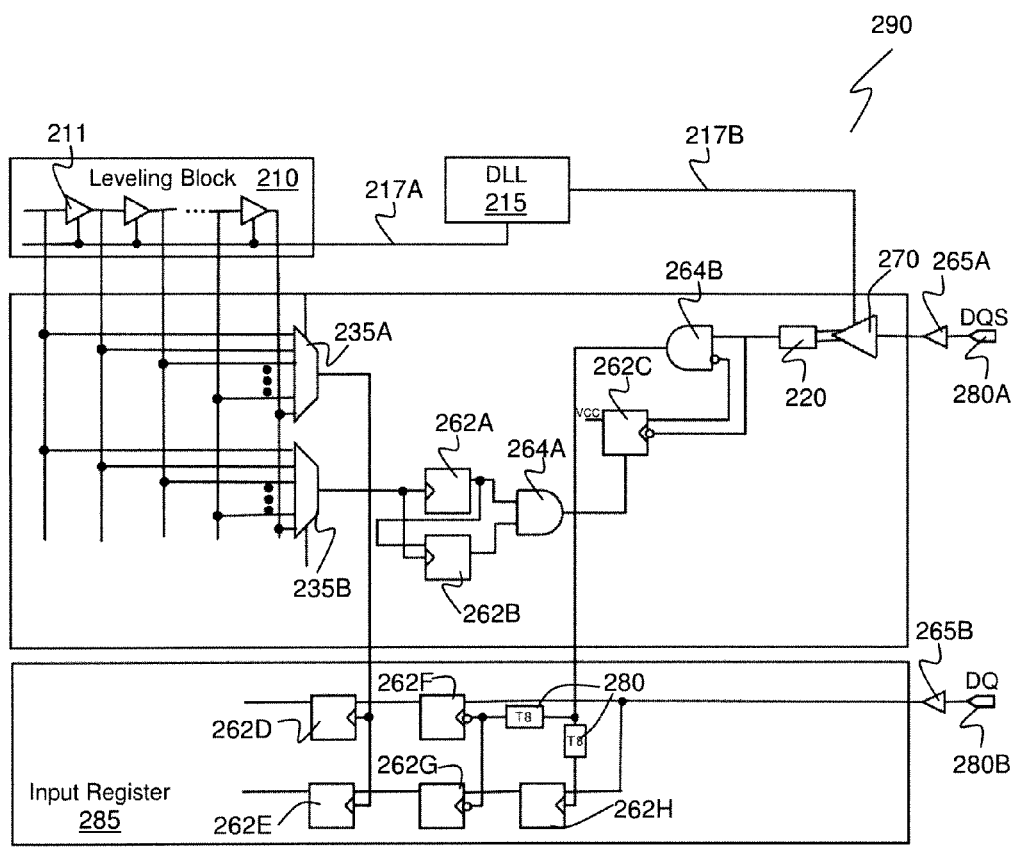
FIG. 2B, meant to be illustrative and not limiting, shows a memory interface read path circuit as one embodiment in accordance with the present invention.

FIG. 2B, meant to be illustrative and not limiting, shows circuit 290 as one embodiment in accordance with the present invention. For the sake of brevity, elements already shown in FIG. 2A and described above, e.g., leveling block 210, DLL block 215, corrector circuit 220, and selector circuits 235A and 235B, will not be described in detail here. One skilled in the art should appreciate that circuit 290 represents a read path of a memory interface circuit in an IC. As such, well known elements are not described in detail so as to not obscure the present invention. In one embodiment, pins 280A and 280B are connected to an external memory module and pins 280A and 280B are input pins that read data from the memory module to the IC. In one such embodiment, pin 280A may be a DQS pin and pin 280B may be a DQ pin. Pin 280A is coupled to input buffer 265A that receives signals transmitted from pin 280A. Signals from input buffer 265A are transmitted to delay chain 270. In one embodiment, delay chain 270 includes several buffers connected in series to produce a delayed version, or a phase shifted version, of the input signal. Corrector circuit 220 corrects distortions in the phase shifted clock signal to produce a clock signal with a substantially 50% duty cycle. The output from delay chain 270 is connected to corrector circuit 220. In one embodiment, the output from delay chain 270 includes a delayed version of the input signal and an inverted version of the delayed version of the same signal. Details of delay chain 270 and corrector circuit 220, shown in FIGS. 3B and 4, respectively, will be described in later paragraphs. The output of corrector circuit 220 is coupled to one of the input terminals of logic gate 264B and the clock terminal of register 262C. One skilled in the art should appreciate that the clock terminal of register 262C is an active low terminal, in one embodiment. In other words, in the embodiment of FIG. 2B, register 262C is triggered by the falling edges of the received clock signal.

In the embodiment of FIG. 2B, register 262C outputs a logic high signal and is connected to one of the other input terminals of logic gate 264B. Selector circuit 235B selects a DQS enable signal to control registers 262A and 262B. In one embodiment, the DQS enable signal is also known as a postamble clock signal. It should be appreciated that the postamble clock signal is a clock signal that has been calibrated to achieve correct timing for the DQS enable signal. The output of selector circuit 235B is connected to the clock terminals of selector circuits 262A and 262B. Selector circuits 262A and 262B are coupled to logic gate 264A to control the clear terminal of register 262C. Register 262C is cleared when registers 262A and 262B are enabled. In one embodiment, registers 262A and 262B, together with logic gate 264A, are enabled only when circuit 290 is reading from a memory module in order to prevent glitches in the circuit when circuit 290 is not reading from the memory module. In another embodiment, the postamble signal from selector circuit 235B gates pin 280A to prevent glitches or false edges in the clock signal.

Referring still to FIG. 2B, pin 280B is connected to input buffer 265B. In one embodiment, pin 280B is a DQ pin that reads data from an external memory module and transmits that data to input register 285. In the embodiment of FIG. 2B, input register 285 includes a few storage elements, or registers, 262D-262H, that are connected to each other as illustrated. Data or signals received at pin 280B are transmitted through input buffer 265B to registers 262D-262H. Registers 262F, 262G and 262H are controlled by the corrected clock output signal from logic gate 264B. The clock output signal may be connected to delay circuits 280. One skilled in the art should appreciate that delay circuits 280 are simple delay chains, e.g., two inverters coupled in series, that are used to correct or reduce clock skews in the circuit. As such, delay circuits 280 may be bypassed when the skew is substantially low. It should be appreciated that circuit 290 may be connected to an external memory module that operates with a different clock domain. Therefore, in one embodiment, registers 262D and 262E are used to resynchronize the clock signal from the external memory module with the clock signal within the system in this embodiment.

Figure 3A:
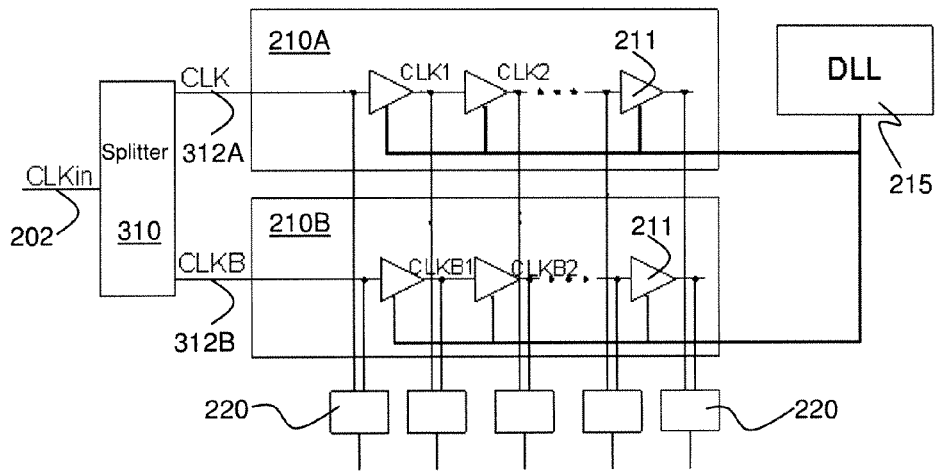
FIG. 3A, meant to be illustrative and not limiting, shows a more detailed representation of a leveling block as one embodiment in accordance with the present invention.

FIG. 3A, meant to be illustrative and not limiting, shows a more detailed representation of leveling block 210 as one embodiment in accordance with the present invention. Clock signal 202 is connected to splitter circuit 310. Splitter circuit 310 splits clock input signal 202 to generate two different clock signals 312A and 312B. In one embodiment, clock signal 312E is an inverted version of clock signal 312A. The two clock signals, i.e., 312A and 312B, are coupled to leveling delay blocks 210A and 210B. Each of leveling delay blocks 210A and 210B includes multiple delay buffers 211 connected in series. Each of buffers 211 generates a delayed version of the corresponding clock signals 312A and 312B. The output from each of buffers 211 is connected to corrector circuit 220. DLL block 215 is connected to each of buffers 211 in leveling delay blocks 210A and 210B. Each of corrector circuits 220 outputs a clock signal with a corrected duty cycle based on the corresponding delayed clock signals from leveling delay blocks 210A and 210B. In the embodiment of FIG. 2A, the clock signal generated by each of corrector circuits 220 is coupled to selector circuit 235A and 235B.

Figure 3B:
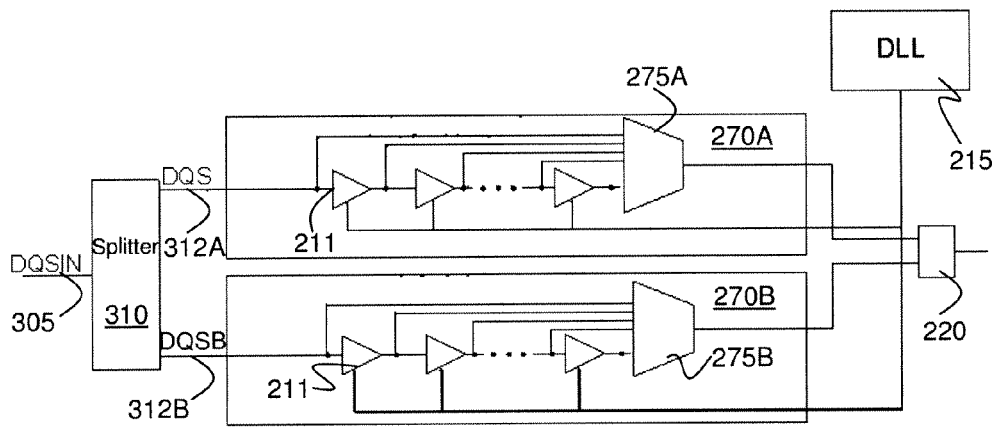
FIG. 3B, meant to be illustrative and not limiting, shows a more detailed representation of a delay chain as one embodiment in accordance with the present invention.

FIG. 3B, meant to be illustrative and not limiting, shows a more detailed representation of delay chain 270 of FIG. 2B as one embodiment in accordance with the present invention. DLL block 215 is connected to each of delay chains 270A and 270B. Terminal DQSIN 305 is connected to input buffer 265A of FIG. 2B. Splitter circuit 310 splits the clock signal received at terminal DQSIN 305 into clock signals 312A and 312B. In the embodiment of FIG. 3B, clock signal 312E is an inverted version of clock signal 312A. Each of delay chains 270A and 270B includes multiple buffers 211 connected in series. The output from each of the buffers 211 in delay chain 270A and 270B is connected to selector circuit 275A and 275B, respectively. The output from each of delay chains 270A and 270B is connected to corrector circuit 220. In the embodiment of FIG. 3B, corrector circuit 220 generates a clock signal with a corrected duty cycle based on the clock signals from delay chains 270A and 270B. The clock signal with the corrected duty cycle is connected to logic gate 264B and register 262C in the embodiment of FIG. 2B. Even though only three buffers 211 are shown in leveling blocks 210A and 210B of FIG. 3A, and delay chains 270A and 270B of FIG. 3B, one skilled in the art should appreciate that the required number of buffers may vary across different circuits for different applications. Thus, more or fewer buffers 211 can be used in leveling blocks 210A and 210B and delay chains 270A and 270B.

Figure 4:
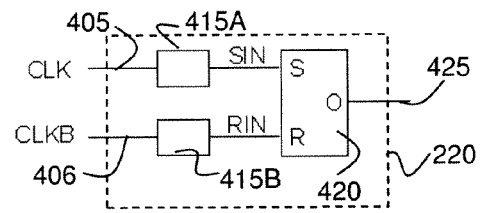
FIG. 4, meant to be illustrative and not limiting, shows a more detailed representation of a corrector circuit as one embodiment in accordance with the present invention.

FIG. 4, meant to be illustrative and not limiting, shows a more detailed representation of corrector circuit 220 as one embodiment in accordance with the present invention. Corrector circuit 220 includes two pulse generator circuits, 415A and 415B, connected to latch 420. Clock signals 405A and 405B are similar to the output signals from leveling blocks 210A, 210B and delay chains 270A and 270B in the embodiments of FIGS. 3A and 3B. Clock signals 405A and 405B are connected to pulse generator circuits 415A and 415B, respectively. Pulse generator circuits 415A and 415B generate relatively small pulses based on clock signals 405A and 405B, respectively. Details of how the pulses are generated are discussed with reference to FIG. 5B and FIG. 6. In the embodiment of FIG. 4, latch 420 is an SR-latch and pulse generator 415A is connected to the set terminal of latch 420 while pulse generator 415B is connected to the reset terminal of latch 420. In one embodiment, pulse generators 415A and 415B generate non-overlapping set and reset signals, respectively. In an exemplary embodiment, output 425 of SR-latch 420 is a clock signal with a corrected duty cycle that is generated based on the pulses from pulse generators 415A and 415B.

Figure 5A:
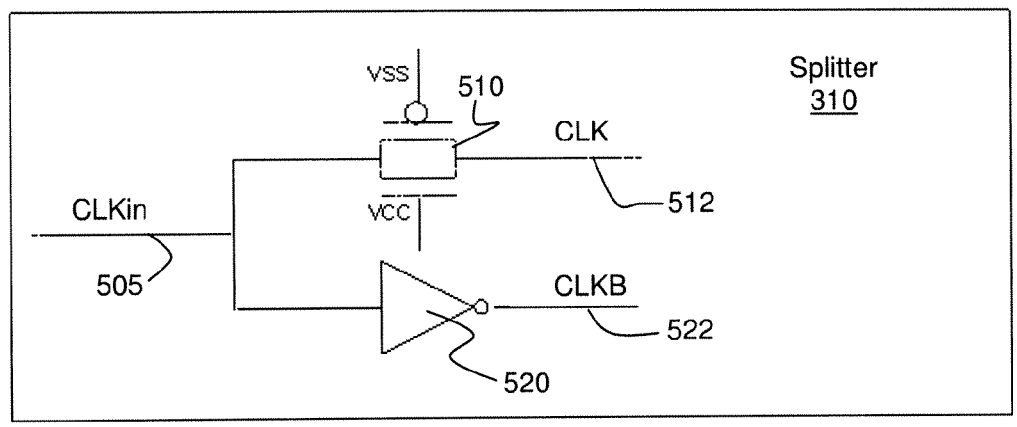
FIG. 5A, meant to be illustrative and not limiting, shows a more detailed representation of a splitter circuit as one embodiment in accordance with the present invention.

FIG. 5A, meant to be illustrative and not limiting, shows a more detailed representation of splitter circuit 310 as one embodiment in accordance with the present invention. Splitter circuit 310 includes pass gate 510 and inverter 520. In the embodiment of FIG. 5A, pass gate 510 is a complementary metal-oxide-semiconductor (CMOS) pass gate. Splitter circuit 310 receives a clock signal, CLKin signal 505, and splits the signal into CLK 512 and CLKB 522 signals. CLKin signal 505 is transmitted through pass gate 510 and inverter 520. Inverter 520 inverts CLKin signal 505 to generate CLKB signal 522. In the embodiment of FIG. 5A, clock signal CLKB 522 is an inverted version of clock signal CLK 512. Each of clock signals CLK 512 and CLKB 522 may be connected to a leveling delay block or a delay chain as shown in the embodiments of FIGS. 3A and 3B, respectively.

Figure 5B:
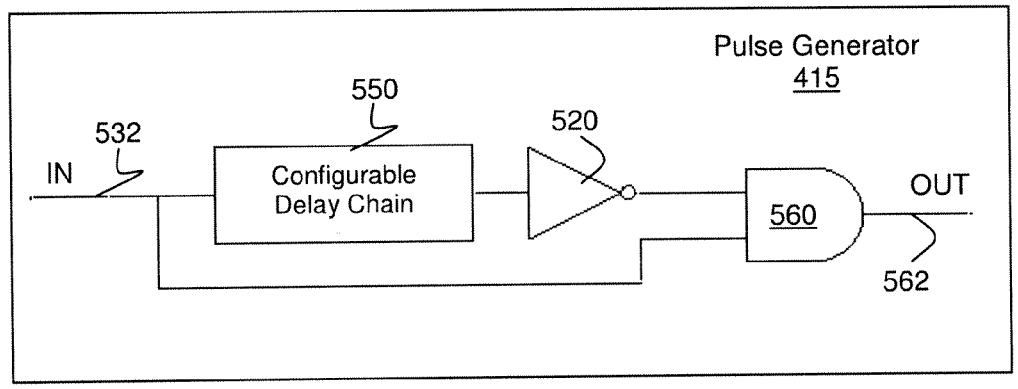
FIG. 5B, meant to be illustrative and not limiting, shows a more detailed representation of a pulse generator circuit.

FIG. 5B, meant to be illustrative and not limiting, shows a more detailed representation of pulse generator circuit 415. Input signal IN 532 is connected to configurable delay chain circuit 550 in pulse generator circuit 415. In the embodiment of FIG. 5B, input signal IN 532 may be connected to either clock signal CLK 512 or clock signal CLKB 522 as shown in FIG. 5A. Configurable delay chain circuit 550 controls the width of the pulses that are generated by pulse generator circuit 415. The signal from configurable delay chain circuit 550 is inverted by inverter 520 and connected to logic gate 560. In the embodiment of FIG. 5B, logic gate 560 is an AND gate that receives the inverted signal from configurable delay chain circuit 550 and input signal IN 532. Output signal OUT 562 is generated based on a logic state of input signal IN 532 and the inverted signal from configurable delay chain circuit 550. In an exemplary embodiment, output signal OUT 562 is a signal with relatively small pulses. Output signal OUT 562 may be connected to a latch. In the illustrative embodiment of FIG. 4, output signals from pulse generators 415A and 415B are connected to the set and reset terminals, respectively, of latch 420.

Figure 5C:
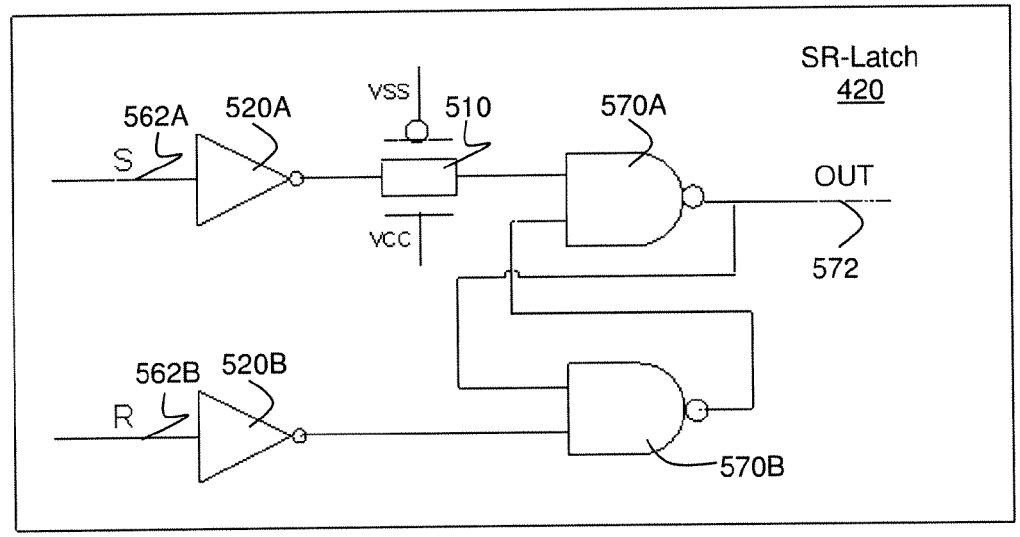
FIG. 5C, meant to be illustrative and not limiting, shows a detailed representation of a latch as one embodiment in the present invention.

FIG. 5C, meant to be illustrative and not limiting, shows a detailed representation of latch 420 as one embodiment in the present invention. It should be appreciated that in one embodiment, latch 420 is an SR-latch and as such, well-known elements of such a latch are not described in detail so as not to obscure the present invention unnecessarily. Latch 420 includes two inverters, 520A and 520B, and two NAND gates, 570A and 570B. Pass gate 510 is coupled to the output of inverter 520A and an input of NAND gate 570A. In one embodiment, pass gate 510 is used to equalize the signal paths from input signal S 562A to output OUT 572 and input signal R 562B to output OUT 572. Input signal S 562A and input signal R 562B are generated by a pulse generator circuit. In the illustrative embodiment of FIG. 4, input signal S 562A is generated by pulse generator 415A while input signal R 562B is generated by pulse generator 415B. In one embodiment, output OUT 572 of latch 420 is a clock signal with a substantially 50% duty cycle that is generated based on the pulses from input signal S 562A and input signal R 562B. Even though a latch is used in this embodiment, one skilled in the art should appreciate that similar logic or storage elements that perform similar functions can be used in place of a latch in this context.

Figure 6:
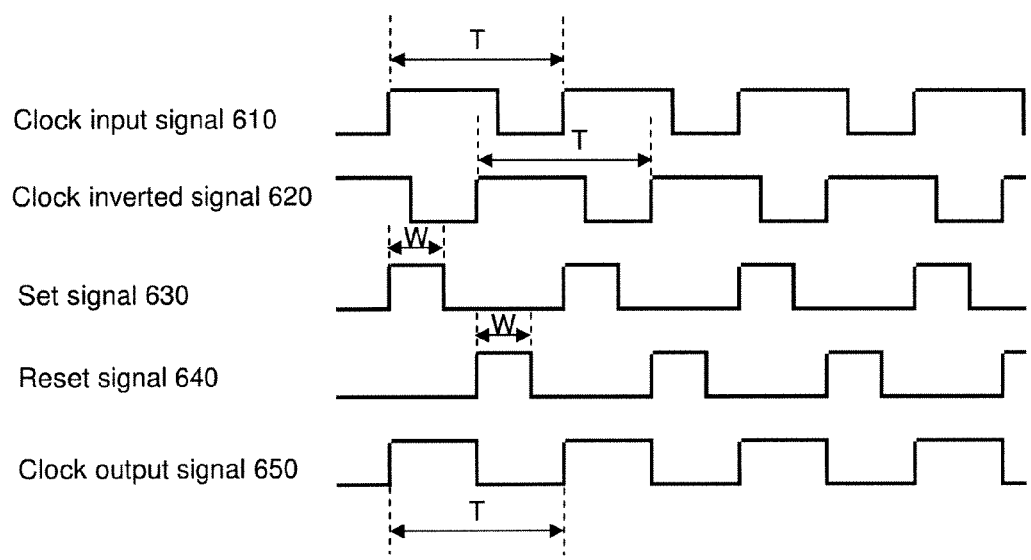
FIG. 6, meant to be illustrative and not limiting, shows exemplary waveforms that describe the relationship between the clock signal, the inverted version of the clock signal, the set pulse signal, the reset pulse signal and the clock output signal.

FIG. 6, meant to be illustrative and not limiting, shows exemplary waveforms 610, 620, 630, 640 and 650 that describe the relationship between the clock input signal, the inverted version of the clock signal, the set pulse signal, the reset pulse signal and the clock output signal in accordance with one embodiment of the invention. Waveform 610 is an exemplary waveform of a clock input signal and waveform 620 is an exemplary waveform of the inverted version of the clock input signal. In one embodiment, the clock input signal is a phase shifted clock signal with a delay and the inverted version of the clock input signal is an inverted version of the phase shifted clock signal with the delay. In one embodiment, the clock input signal is a clock output signal from one of buffers 211 in leveling block 210A and the inverted version of the clock output signal from one of buffers 211 in leveling block 210B of FIG. 3A. As shown in FIG. 6, the clock input signal as represented by waveform 610 does not have a 50% duty cycle as each clock period, T, does not have an equal period of logic high and logic low level. In the illustrative embodiment of FIG. 6, the clock input signal has a substantially longer logic high period in each clock period, T. As such, it should be appreciated that the inverted version of the clock signal as represented by waveform 620 also does not have a 50% duty cycle.

Referring still to FIG. 6, waveform 630 shows the generated set signal. In the illustrative embodiment of FIG. 6, the set signal as represented by waveform 630 is an active-high signal with substantially short active pulses. One skilled in the art should appreciate that an active-high signal is considered "active" when it is at a logic high level, i.e., logic 1. In this instance, the set signal as represented by waveform 630 is active when waveform 630 is at a logic high state. Waveform 640 shows the generated reset signal with relatively short pulses. In the illustrative embodiment of FIG. 6, the set signal 630 changes from a logic low level to a logic high level when the clock input signal 610 transitions from a logic low level to a logic high level. The reset signal 640 changes from a logic low level to a logic high level when the inverted version of the clock input signal 620 transitions from a logic low level to a logic high level. In an exemplary embodiment, the width, W, of pulses in the set signal and reset signal as represented by waveforms 630 and 640, respectively, can be adjusted. In the embodiment of FIG. 5B, configurable delay chain circuit 550 is used to adjust the width, W, of each of the set 630 and reset 640 pulses. In one embodiment, the width, W, of each of the set 630 and reset 640 pulses are less than ½ period, ½ T, of the clock input signal 610.

Referring still to FIG. 6, waveform 650 shows a generated clock output signal with a substantially 50% duty cycle, i.e., equal periods of high and low logic levels. In the embodiment of FIG. 6, the clock output signal 650 is generated based on the set 630 and reset 640 signals. The clock output signal 650 changes from a logic low level to a logic high level when the set signal 630 changes from a logic low level to a logic high level. When the reset signal 640 changes from a logic low level to a logic high level, the clock output signal 650 transitions from a logic high level to a logic low level to achieve a substantially 50% duty cycle. In the illustrative embodiment of FIG. 5C, the set and reset pulses as represented by waveforms 630 and 640, respectively, are used to set and reset latch 420 of FIG. 5C. Output OUT 572 in FIG. 5C represents the clock output signal shown in waveform 650. Each clock period, T, of the clock output signal in the embodiment of FIG. 6 has a substantially 50% duty cycle. In an exemplary embodiment, the clock output signal has a duty cycle that is not worse than 45/55.

Figure 7:
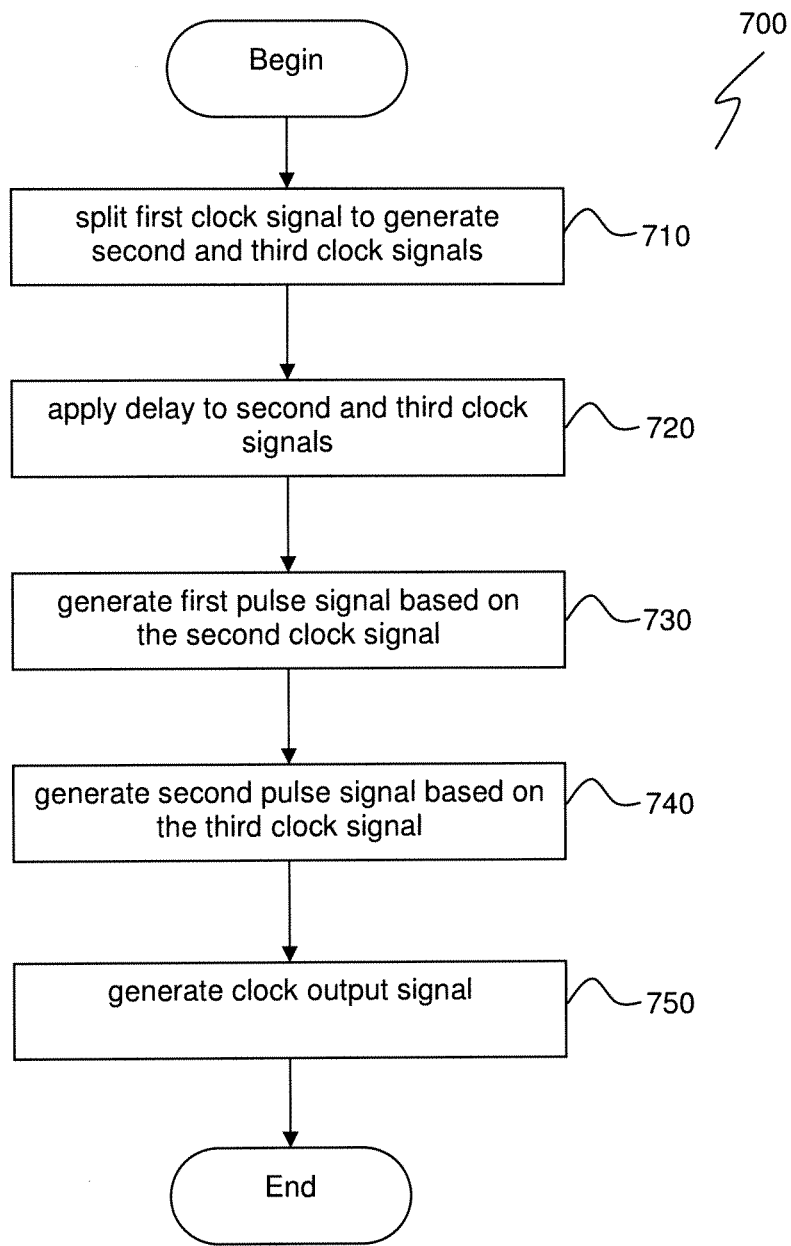
FIG. 7, meant to be illustrative and not limiting, is a simplified flow chart that shows a method flow for operating an IC as another embodiment in accordance with the present invention.

FIG. 7, meant to be illustrative and not limiting, is a simplified flow chart that shows method flow 700 for operating an IC as another embodiment in accordance with the present invention. A first clock signal is split in operation 710 to generate second and third clock signals. In the illustrative embodiment of FIG. 3A, CLKin signal 202 is split into CLK signal 312A and CLKB signal 312B by splitter circuit 310. The third clock signal may be an inverted version of the second clock signal, in one embodiment. A delay is applied to the second and third clock signals to generate delayed versions of the second and third clock signals in operation 720. In an exemplary embodiment, the delayed versions of the second and third clock signals are phase shifted versions of the second and third clock signals. In the illustrative embodiment of FIG. 2A, the delayed version of the clock signal is generated by leveling block 210. A pulse signal is generated based on the delayed version of the second clock signal in operation 730. In one embodiment, the pulse signal has relatively small pulses of logic high level and the width of each of the pulses is less than half of the width of the logic high pulse of the second clock signal. A configurable delay chain circuit, e.g., configurable delay 550 of FIG. 5B, may used to adjust the width of each of the pulses. In another embodiment, the pulse signal is a set pulse signal that is used to set a latch, such as SR-latch 420 as shown in FIG. 5C. The pulse signal transitions from a logic low level to a logic high level when the second clock signal transitions from a logic low level to a logic high level. In the illustrative embodiment of FIG. 6, waveform 630 shows a representation of the pulse signal.

Referring still to FIG. 7, another pulse signal is generated in operation 740. This pulse signal is generated based on the third clock signal. In an exemplary embodiment, the pulse signal generated in operation 740 is a reset pulse signal that transitions from a logic low level to a logic high level when the third clock signal transitions from a logic low level to a logic high level. The reset pulse signal is represented by waveform 640 in the illustrative embodiment of FIG. 6. The reset pulse signal is used to reset latch 420 in the embodiment of FIG. 5C. A clock output signal is generated in operation 750. The clock output signal, generated based on the two pulse signals generated in operations 730 and 740, has a corrected duty cycle. In the illustrative embodiment of FIG. 6, the clock output signal is represented by waveform 650. In one embodiment, the rising edges of the clock output signal occurs substantially contemporaneously with the rising edges of the pulse signal generated in operation 730 while the falling edges of the clock output signal occurs substantially contemporaneously with the rising edges of the pulse signal generated in operation 740. In another embodiment, the clock output signal is a clock signal with a substantially symmetrical, i.e., close to 50%, duty cycle.

The embodiments, thus far, were described with respect to integrated circuits. The method and apparatus described herein may be incorporated into any suitable circuit. For example, the method and apparatus may be incorporated into numerous types of devices such as microprocessors or programmable logic devices. Exemplary programmable logic devices include programmable array logic (PAL), programmable logic array (PLA), field programmable logic array (FPLA), electrically programmable logic devices (EPLD), electrically erasable programmable logic device (EEPLD), logic cell array (LCA), field programmable gate array (FPGA), application specific standard product (ASSP), application specific integrated circuit (ASIC), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:
1. An integrated circuit (IC), comprising:
   a splitter circuit coupled to receive a first clock signal, wherein the splitter circuit generates a second clock signal and a third clock signal based on the first clock signal, and wherein the splitter comprises a pass gate coupled to receive the first clock signal, the pass gate generating the second clock signal;
   a first delay circuit coupled to receive the second clock signal, wherein the first delay circuit generates a delayed version of the second clock signal;
   a second delay circuit coupled to receive the third clock signal, wherein the second delay circuit generates a delayed version of the third clock signal;
   a corrector circuit coupled to receive the delayed versions of the second and third clock signals, wherein the corrector circuit generates a clock output signal with a duty cycle modified relative to the first clock signal.

2. The IC of claim 1, further comprising:
a first selector circuit coupled to receive the clock output signal from each of a plurality of the corrector circuit, wherein the first selector circuit selects and outputs a first corrected clock output signal from one of the plurality of corrector circuits; and
a second selector circuit coupled to receive the clock output signal from each of the plurality of the corrector circuits, wherein the second selector circuit selects and outputs a second corrected clock output signal from another of the plurality of the corrector circuits.

3. The IC of claim 2, wherein the second corrected clock output signal is a phase shifted version of the output first corrected clock output signal.

4. The IC of claim 2, wherein the first corrected clock output signal and the second corrected clock output signal are substantially 90 degrees out of phase alignment.

5. The IC of claim 2, further comprising:
a plurality of storage circuits coupled to receive the first and second corrected clock output signals, wherein the plurality of storage circuits is triggered by transitioning edges of the first and second corrected clock output signals.

6. The IC of claim 1, wherein the corrector circuit comprises an SR-latch.

7. The IC of claim 1, wherein the splitter circuit comprises:
an inverter coupled to receive the first clock signal, the inverter generating the third clock signal, wherein the third clock signal is an inverted version of the second clock signal.

8. The IC of claim 1, wherein the first and second delay circuits each includes a plurality of buffers coupled in series.

9. A duty cycle correction circuit, comprising:
a first pulse generator circuit coupled to receive a first clock signal, wherein the first pulse generator circuit generates a first pulse signal based on the first clock signal;
a second pulse generator circuit coupled to receive a second clock signal, wherein the second pulse generator circuit generates a second pulse signal based on the second clock signal;
a latch coupled to receive the first and second pulse signals, wherein the latch generates a clock output signal having a modified duty cycle relative to a clock input signal.

10. The IC of claim 9, further comprising:
a splitter circuit coupled to receive the clock input signal, wherein the splitter circuit splits the clock input signal into third and fourth clock signals; and
a delay chain circuit coupled to receive each of the third and fourth clock signals, wherein the delay chain circuit generates a delayed version for each of the third and fourth clock signals as the first and second clock signals, respectively.

11. The IC of claim 10, wherein the delay circuit comprises a plurality of buffers coupled in series and a selector circuit coupled to receive an output from each of the plurality of buffers.

12. The IC of claim 9, wherein the second clock signal is an inverted version of the first clock signal.

13. The IC of claim 9, wherein the first pulse signal sets the latch and the second pulse signal resets the latch.

14. The IC of claim 9, wherein the first and second pulse generator circuits each comprises:
a configurable delay chain circuit coupled to receive one of the first or second clock signals;
an inverter coupled to an output of the configurable delay chain; and
a logic gate coupled to an output of the inverter and one of the first or second clock signals,
whereby each of the first and second pulse generators generate pulses having a smaller width than pulses of the clock input signal.

15. The IC of claim 14, wherein the configurable delay chain circuit controls a width of the first and second pulse signals.

16. A method of operating an integrated circuit (IC), comprising:
splitting a first clock signal to generate second and third clock signals;
applying a delay to the second and third clock signals to generate delayed versions of the second and third clock signals;
generating a first pulse signal based on the delayed version of the second clock signal, wherein the first pulse signal transitions from a first logic level to a second logic level according to a transition of the second clock signal;
generating a second pulse signal based on the delayed version of the third clock signal, wherein the second pulse signal transitions from the first logic level to the second logic level according to a transition of the third clock signal; and
generating a clock output signal with a modified duty cycle relative to the first clock signal, wherein the clock output signal is a phase shifted version of the first clock signal.

17. The method of claim 16, wherein a width of the first pulse signal is less than half of a width of the second clock signal.

18. The method of claim 16, wherein a rising edge of the clock output signal occurs substantially contemporaneously with a rising edge of the first pulse signal and a falling edge of the output clock signal occurs substantially contemporaneously as a rising edge of the second pulse signal.

19. The method of claim 16, wherein the third clock signal is an inverted version of the second clock signal.

20. The method of claim 16, wherein the generating the first and second pulse signals includes setting a latch when the second clock signal transitions from the first logic level to the second logic level and resetting the latch when the third clock signal transitions from the first logic level to the second logic level.

* * * * *